United States Patent
Yang et al.

(10) Patent No.: US 11,204,401 B2
(45) Date of Patent: Dec. 21, 2021

(54) CYLINDRICAL-LIKE SINGLE LAYER TECHNOLOGY (SLT) MAGNETIC RESONANCE IMAGING (MRI) ARRAY COIL WITH AT LEAST ONE ROW AS A BIRDCAGE COIL IN TRANSMIT MODE

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Haoqin Zhu, Mayfield Village, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 0 days.

(21) Appl. No.: 16/815,460

(22) Filed: Mar. 11, 2020

(65) Prior Publication Data

US 2020/0292642 A1    Sep. 17, 2020

Related U.S. Application Data

(60) Provisional application No. 62/816,962, filed on Mar. 12, 2019.

(51) Int. Cl.
| | | |
|---|---|---|
| *G01R 33/3415* | (2006.01) | |
| *G01R 33/34* | (2006.01) | |
| *G01R 33/36* | (2006.01) | |

(52) U.S. Cl.
CPC ..... *G01R 33/3415* (2013.01); *G01R 33/34076* (2013.01); *G01R 33/3635* (2013.01); *G01R 33/3642* (2013.01); *G01R 33/3678* (2013.01)

(58) Field of Classification Search
CPC ... A61B 5/0042; A61B 5/0055; A61B 5/7203; G01R 33/34007; G01R 33/34046; G01R 33/3678

See application file for complete search history.

(56) References Cited

U.S. PATENT DOCUMENTS

| | | | |
|---|---|---|---|
| 4,680,549 A | 7/1987 | Tanttu | |
| 4,987,370 A | 1/1991 | Leussler et al. | |
| 5,144,240 A * | 9/1992 | Mehdizadeh | G01R 33/34046 324/318 |

(Continued)

OTHER PUBLICATIONS

Wang et al. "Inductive Coupled Local TX Coil Design." Proc. Intl. Soc. Mag. Reson. Med. 18 (2010), published May 2010.

(Continued)

*Primary Examiner* — Dixomara Vargas
(74) *Attorney, Agent, or Firm* — Eschweiler & Potashnik, LLC (57) ABSTRACT

Embodiments relate to cylindrical MRI coils with at least one row as a birdcage row in a transmit mode. One example embodiment is a MRI Radio Frequency (RF) coil array comprising two or more rows of four or more RF coil elements each. Each of the RF coil elements can be configured to resonate at a working frequency of the coil array in a receive mode. At least one of the rows can be configured as a birdcage coil in the transmit mode, and the two or more rows can inductively couple together such that all the two or more rows can resonate together in the transmit mode at the working frequency.

20 Claims, 7 Drawing Sheets

(56) References Cited

U.S. PATENT DOCUMENTS

| | | | | |
|---|---|---|---|---|
| 7,253,622 | B2* | 8/2007 | Saylor | G01R 33/34046 324/318 |
| 10,386,430 | B2* | 8/2019 | Yang | G01R 33/3642 |
| 2004/0140808 | A1* | 7/2004 | Vaughan, Jr. | G01R 33/5659 324/318 |
| 2006/0033497 | A1* | 2/2006 | Chmielewski | G01R 33/34046 324/318 |
| 2006/0033501 | A1* | 2/2006 | Vaughan, Jr. | G01R 33/34046 324/322 |
| 2006/0173284 | A1* | 8/2006 | Ackerman | G01R 33/34046 600/422 |
| 2007/0007964 | A1* | 1/2007 | Vaughan, Jr. | G01R 33/3635 324/322 |
| 2007/0247160 | A1* | 10/2007 | Vaughan, Jr. | G01R 33/3453 324/322 |
| 2008/0024133 | A1* | 1/2008 | Vaughan | G01R 33/3453 324/318 |
| 2008/0278167 | A1* | 11/2008 | Vaughan, Jr. | G01R 33/345 324/318 |
| 2008/0284436 | A1* | 11/2008 | Weizenecker | G01R 33/3415 324/318 |
| 2009/0021256 | A1* | 1/2009 | Soutome | G01R 33/34046 324/318 |
| 2009/0096553 | A1* | 4/2009 | Driesel | G01R 33/345 333/219 |
| 2010/0213941 | A1* | 8/2010 | Driesel | G01R 33/3415 324/322 |
| 2012/0112748 | A1* | 5/2012 | Hetherington | G01R 33/3635 324/318 |
| 2012/0169340 | A1* | 7/2012 | Leussler | G01R 33/345 324/309 |
| 2013/0184566 | A1* | 7/2013 | Kreischer | G01R 33/34084 600/422 |
| 2014/0055136 | A1* | 2/2014 | Leussler | G01R 33/3415 324/309 |
| 2015/0123660 | A1* | 5/2015 | Vaughan, Jr. | G01R 33/54 324/314 |
| 2018/0081005 | A1* | 3/2018 | Yang | G01R 33/3628 |
| 2018/0081008 | A1* | 3/2018 | Yang | G01R 33/34046 |
| 2018/0275226 | A1* | 9/2018 | Yang | A61B 5/06 |
| 2018/0275233 | A1* | 9/2018 | Yang | G01R 33/34046 |
| 2018/0313918 | A1* | 11/2018 | Yang | G01R 33/34007 |
| 2018/0321339 | A1* | 11/2018 | Yang | G01R 33/3415 |
| 2019/0257898 | A1* | 8/2019 | Yang | G01R 33/3614 |
| 2020/0278405 | A1* | 9/2020 | Yang | G01R 33/3685 |
| 2020/0292643 | A1* | 9/2020 | Yang | G01R 33/365 |

OTHER PUBLICATIONS

Jin et al. "An Innovative Design of Combined Transmit/Receive RF Coils for MRI Imaging." Proc. 2nd Met, Soc. Magn. Reson., p. 1116, published Jun. 1994.

* cited by examiner

CYLINDRICAL-LIKE SINGLE LAYER TECHNOLOGY (SLT) MAGNETIC RESONANCE IMAGING (MRI) ARRAY COIL WITH AT LEAST ONE ROW AS A BIRDCAGE COIL IN TRANSMIT MODE

REFERENCE TO RELATED APPLICATIONS

This application claims the benefit of U.S. Provisional Patent Application No. 62/816,962 filed Mar. 12, 2019, entitled "A CYLINDRICAL-LIKE SINGLE LAYER TECHNOLOGY (SLT) MAGNETIC RESONANCE IMAGING ARRAY COIL WITH AT LEAST ONE ROW AS A BIRDCAGE COIL IN TX MODE", the contents of which are herein incorporated by reference in their entirety.

BACKGROUND

Magnetic resonance imaging (MRI) involves the transmission and receipt of radio frequency (RF) energy. RF energy can be transmitted by a coil. Resulting magnetic resonance (MR) signals can also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils can create the $B_1$ field that rotates the net magnetization in a pulse sequence. RF coils can also detect precessing transverse magnetization. Thus, RF coils can be transmit (Tx) coils, receive (Rx) coils, or transmit and receive (Tx/Rx) coils. An imaging coil should be able to resonate at a selected Larmor frequency. Imaging coils include inductive elements and capacitive elements. The inductive elements and capacitive elements have been implemented according to existing approaches using two terminal passive components (e.g., capacitors). The resonant frequency, f, of a RF coil is determined by the inductance (L) and capacitance (C) of the inductor capacitor circuit according to equation (1):

$$f = \frac{1}{2\pi\sqrt{LC}} \quad (1)$$

Imaging coils may need to be tuned. Tuning an imaging coil may include varying the value of a capacitor. Recall that frequency: $f=\omega/(2\pi)$, wavelength in vacuum: $\lambda=c/f$, and $\lambda=4.7$ m at 1.5 T. Recall also that the Larmor frequency: $f_0=\gamma B_0/(2\pi)$, where (for $^1$H nuclei) $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

DETAILED DESCRIPTION

The present disclosure will now be described with reference to the attached drawing figures, wherein like reference numerals are used to refer to like elements throughout, and wherein the illustrated structures and devices are not necessarily drawn to scale.

Figure 1:
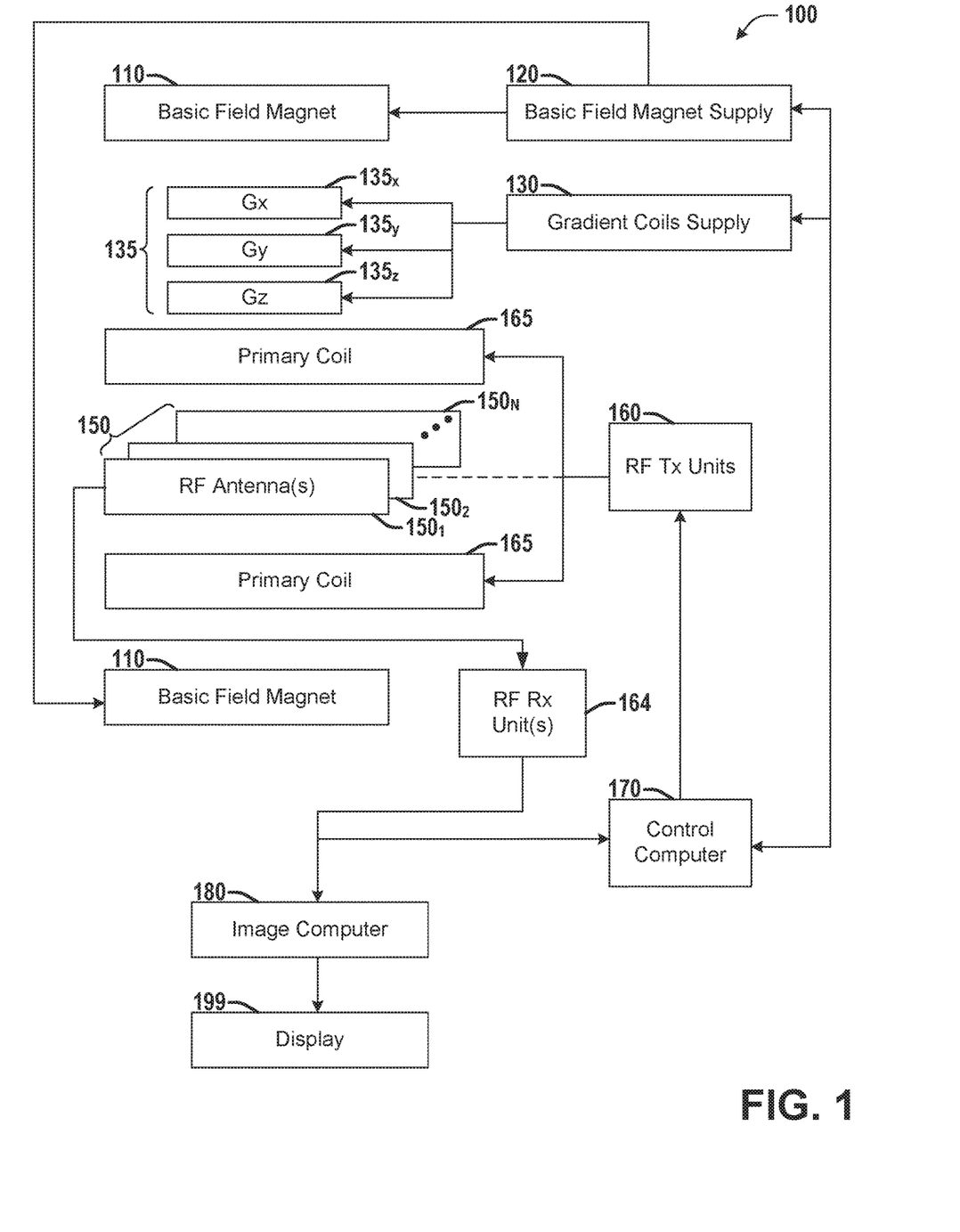
FIG. 1 is a block diagram illustrating an example MRI (Magnetic Resonance Imaging) apparatus that can be configured with example MRI RF (Radio Frequency) coils, coil elements, coil arrays, or circuitry according to one or more embodiments described herein.

Embodiments described herein can be implemented in a MRI (Magnetic Resonance Imaging) system using any suitably configured hardware and/or software. Referring to FIG. 1, illustrated is an example MRI apparatus 100 that can be configured with example MRI RF coils, coil elements, coil arrays, or circuitry according to one or more embodiments described herein. Apparatus 100 includes basic field magnet(s) 110 and a basic field magnet supply 120. Ideally, the basic field magnets 110 would produce a uniform $B_0$ field. However, in practice, the $B_0$ field may not be uniform, and may vary over an object being imaged by the MRI apparatus 100. MRI apparatus 100 can include gradient coils 135 configured to emit gradient magnetic fields like $G_x$ (e.g., via an associated gradient coil $135_x$), $G_y$ (e.g., via an associated gradient coil $135_y$) and $G_z$ (e.g., via an associated gradient coil $135_z$). The gradient coils 135 can be controlled, at least in part, by a gradient coils supply 130. In some examples, the timing, strength, and orientation of the gradient magnetic fields can be controlled, and thus selectively adapted during a MRI procedure.

MRI apparatus 100 can include a primary coil 165 configured to generate RF pulses. The primary coil 165 can be a whole body coil (WBC). The primary coil 165 can be, for example, a birdcage coil. The primary coil 165 can be controlled, at least in part, by a RF transmission unit 160. RF transmission unit 160 can provide a signal to primary coil 165.

MRI apparatus 100 can include a set of RF antennas 150 (e.g., one or more RF antennas $150_1$-$150_N$, which can be as described herein). RF antennas 150 can be configured to generate RF pulses and/or to receive resulting magnetic resonance signals from an object to which the RF pulses are directed. A RF antenna 150 configured solely to generate RF pulses can be referred to herein as a transmit (or Tx) antenna (or coil or coil array), while a RF antenna 150 configured solely to receive resulting magnetic resonance signals from an object to which the RF pulses are directed can be referred to herein as a receive (or Rx) antenna (or coil or coil array), and a RF antenna 150 configured to both generate RF pulses and receive resulting magnetic resonance signals can be referred to herein as a transmit/receive (or Tx/Rx) antenna (or coil or coil array). Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, RF antennas 150 can be configured to inductively couple with primary coil 165 and generate RF pulses and to receive resulting magnetic resonance signals from an object to which the RF pulses are directed. In other embodiments, RF antennas 150 can be electrically coupled to a power source (e.g., RF Tx unit 160) that can drive RF antennas 150 to generate RF pulses, and RF antennas can also be configured to receive resulting magnetic resonance signals from an object to which the RF pulses are directed. In one embodiment, one or more members of the set of RF antennas 150 can be fabricated from flexible coaxial cable, or other conductive material. The set of RF antennas 150 can be connected with a RF receive unit 164.

The gradient coils supply 130 and the RF transmission units 160 can be controlled, at least in part, by a control computer 170. The magnetic resonance signals received from the set of RF antennas 150 can be employed to generate an image, and thus can be subject to a transformation process like a two dimensional fast Fourier transform (FFT) that generates pixilated image data. The transformation can be performed by an image computer 180 or other similar processing device. The image data can then be shown on a display 199. RF Rx Units 164 can be connected with control computer 170 or image computer 180. While FIG. 1 illustrates an example MRI apparatus 100 that includes various components connected in various ways, it is to be appreciated that other MRI apparatus can include other components connected in other ways, and can be employed in connection with various embodiments discussed herein.

In one embodiment, MRI apparatus 100 includes control computer 170. In one example, a member of the set of RF antennas 150 can be individually controllable by the control computer 170. A member of the set of RF antennas 150 can be an example MRI RF coil array including, for example, MRI RF coil arrays as described herein. In various embodiments, the set of RF antennas 150 can include various combinations of example embodiments of MRI RF coil arrays, elements or example embodiments of MRF RF coil arrays, including single-layer MRI RF coil elements or single-layer MRI RF coil arrays, according to various embodiments described herein.

A MRI apparatus can include, among other components, a controller (e.g., control computer 170) and a RF coil (e.g., primary coil 165) operably connected to the controller. The controller can provide the RF coil with a current, a voltage, or a control signal. The coil can be a whole body coil. The coil can inductively couple with an example MRI RF coil element, or MRI RF coil array, as described herein. Control computer 170 can provide a DC bias current, or control a DC bias control circuit to control the application of a DC bias current to MRI RF coil arrays or elements that can be part of antennas 150.

A working MRI system employs two kinds of MRI coils. The first kind is a transmitter (Tx) coil. The function of a Tx coil is to transmit high power RF energy into human anatomy to excite spins of nuclei in a Tx mode. The second kind of coil is a receiver (Rx) coil. The function of a Rx coil is to detect the very weak signal from spins of nuclei of human anatomy in a Rx mode.

Most MRI systems have a built-in whole body coil (WBC) as a transmitter coil. One of the main disadvantages of using a WBC as the Tx coil is that the WBC will apply RF energy to all portions of the human body which are exposed inside the WBC, even if the scan is for only a small anatomical region. For example, when a head scan is performed and the WBC is used, not only will the head receive high level RF energy, but the shoulder and the chest also will. However, this creates a problem of high Specific Absorption Rate (SAR), because SAR increases significantly when the anatomy gets closer to the WBC, and in this case, the shoulder is closer to the WBC than the head.

To overcome the SAR disadvantage of the WBC, another kind of Tx coil, a local Tx coil, can be used to mitigate SAR. A local Tx coil is designed to only apply transmitting RF energy into the anatomy being scanned. There are several approaches to transmit energy from a power source to a local Tx coil.

A first approach employs a direct connection, which can use coax cables or wires. This approach is energy efficient and the energy loss in wires is trivial. However, dedicated wiring is required.

A second approach is to use inductive coupling. For this approach, a primary coil is directly connected to a RF transmitting power amplifier. The primary coil can be the WBC or another large coil, and is a first resonant LC circuit. A second coil (e.g., the local coil) can be a second resonant circuit that can inductively couple to the primary coil. As a result, energy can be transferred from the primary coil to the second coil. The second coil can be used to excite nearby anatomy more efficiently due to its smaller size and proximity. Compared to the first approach, the inductive coupling approach is less efficient than direct wiring but still significantly more efficient than the WBC. The main advantage of the second approach is that no wiring is required. One existing system employed a special configuration to realize an inductively coupled knee coil. In this configuration the knee coil has two layers. The first (inner) layer is a plural of receiving coil elements which detect signal from anatomy in the receive mode and is decoupled in the transmit mode. The second (outer) layer is a standard birdcage coil which couples to the WBC to create local amplified transmitting field in the Tx mode and is decoupled in Rx mode.

A third approach is the uni-coil concept. In Rx mode of this approach the coil has multiple receive elements. In Tx mode the coil uses multiple diodes to connect all coil elements to create a birdcage coil for a uniform transmitting $B_1+$ field. This approach can be very complicated if there are many coil elements and multiple rows in a cylindrical-like coil, because many diodes must be used to connect all the coil elements together. This can become even more complicated if the multiple rows have different number of elements for each row. The creation of such a birdcage is very difficult because the numbers of rungs are different from row to row.

A fourth approach is an approach employing single layer technology (SLT), described in greater detail in co-owned U.S. patent application Ser. No. 15/583,345, entitled "SINGLE LAYER MAGNETIC RESONANCE IMAGING TRANSMIT/RECEIVE RADIO FREQUENCY COIL" (published as U.S. Pre-Grant Pub. No. 2018/0081005), the entirety of which is incorporated herein by reference. In this approach, each coil element can be allowed to resonate with the WBC in Tx mode. If the induced transmitting $B_1+$ field's magnitude and phase in each coil element are properly adjusted, the combined induced $B_1+$ field is uniform. This method does not use the many diodes of the third approach to connect all the coil elements together, which makes the coil structure simple. However, one challenge of the SLT approach is that each coil element must be tuned probably in Tx mode and the tuning frequency of each element could be different in Tx mode. For a high channel count coil, this tuning process could take a long time.

A fifth approach is a local Tx/Rx approach described in greater detail in co-owned U.S. patent application Ser. No. 16/278,763, entitled "MAGNETIC RESONANCE IMAGING (MRI) TRANSMIT (TX)/RECEIVE (RX) COIL USING THE SAME ARRAY COIL" (published as U.S. Pre-Grant Pub. No. 2019/0257898), the entirety of which is incorporated herein by reference. In this approach, all the coil elements are allowed to resonate, and are coupled to each other in Tx mode. One of the resulting coupling modes is a uniform mode. Then the coil is driven at one or more coil elements with the right magnitude and phase of Tx RF power signal(s) to feed the uniform mode. As a result, a uniform Tx $B_{1^+}$ field is generated in Tx mode.

Figure 2:
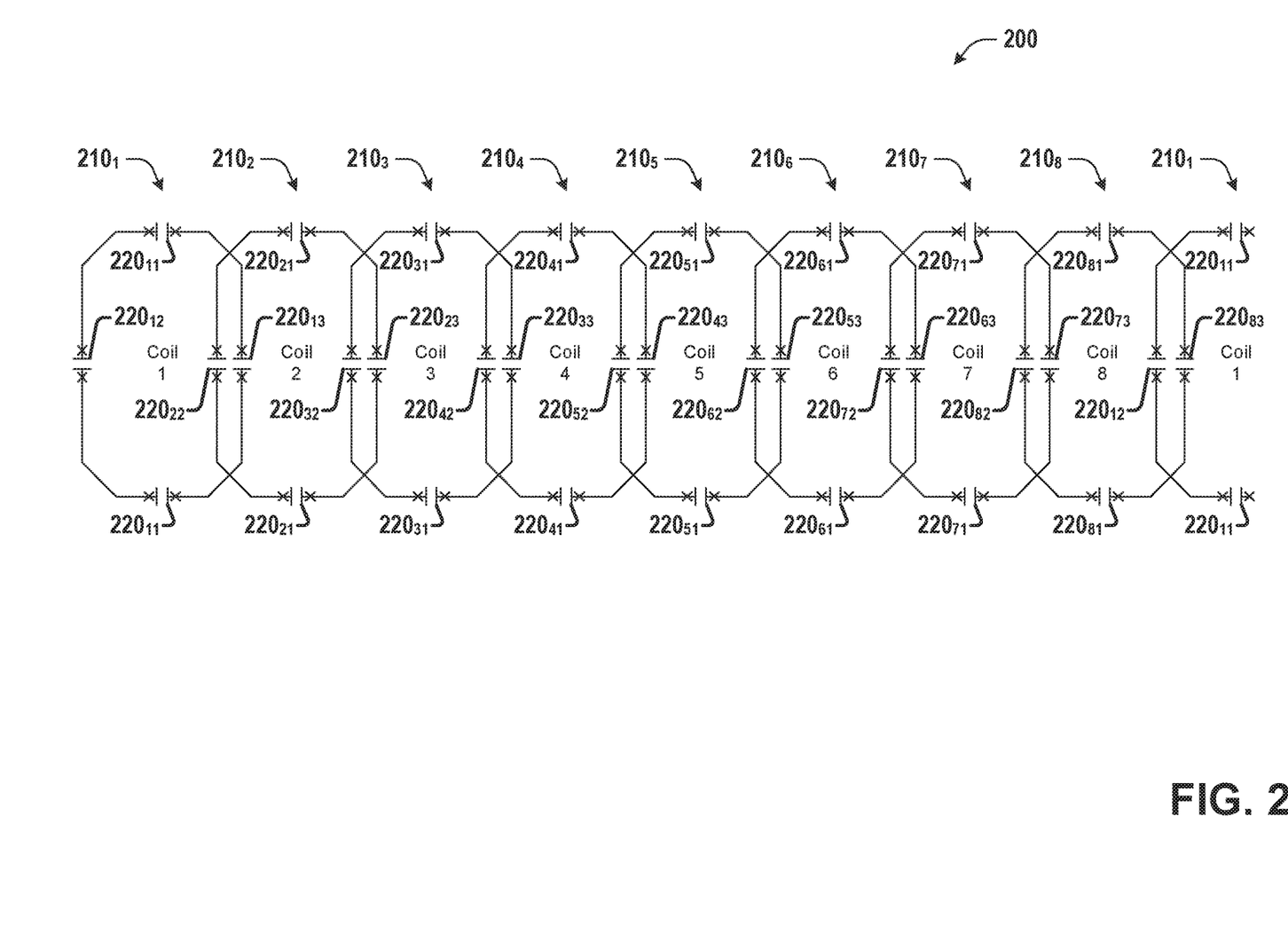
FIG. 2 is a diagram illustrating an example row of a MRI coil comprising eight channels, according to various embodiments discussed herein.

Various embodiments can employ a new approach discussed herein to create a uniform $B_{1^+}$ field in Tx mode for a high channel count coil with multiple rows in a cylindrical-like RF coil. For purposes of illustration, techniques employed herein are discussed in connection with a specific example embodiment of a three row and 24 channel cylindrical-like coil. However, in various aspects, embodiments can comprise a coil or coil array (e.g., employable in a Tx mode and/or a Rx mode as a RF antenna (e.g., RF antenna 150) in a MRI system (e.g., MRI system 100) that can comprise two or more rows (e.g., m rows, wherein m can be, e.g., two, three, four or more, etc.), wherein each row can have a plurality of channels (which can be the same or a different number for different rows, e.g., 8, or more or less, etc.). For simplicity, however, aspects of various embodiments are discussed in connection with an example coil having three rows, wherein each row has 8 coil elements. Referring to FIG. 2, illustrated is a diagram showing an example row 200 of a MRI coil comprising eight channels $210_i$, according to various embodiments discussed herein. In various embodiments, as shown in FIG. 2, neighboring coil elements (e.g., $210_i$ and $210_{i\pm1}$, wherein the subscript i±1 (for i=0 n) can be taken mod n, wherein n is the number of coil elements in the row (e.g., such that 0=n mod n and n+1=1 mod n)) can partially overlap to minimize the mutual inductance coupling, such that row 200 can be employed as a standard array coil in Rx mode. Each coil element $210i$ can comprise a conductive element (e.g., wire, copper trace, coax cable, etc.) that forms the 'loop' (e.g., closed circuit, independent of the specific geometric shape) of that coil element $210_i$ and has an inductance (not labeled in FIG. 2). Each coil element $210_i$ also comprise a plurality of capacitors $220_{ij}$. In the example of FIG. 2, each coil element $210_i$ comprises a first capacitor $220_{i1}$ on a top edge (relative to FIG. 2, but independent of actual orientation) of coil element $210_i$, a second capacitor $220_{i2}$ on a portion of coil element $210_i$ overlapping a previous coil element $220_{i-1}$, a third capacitor $220_{i3}$ on a portion of coil element $210_i$ overlapping a next coil element $220_{i+1}$, and a fourth capacitor on a bottom edge (relative to FIG. 2, but independent of actual orientation) of coil element $210_i$, although in various embodiments, one or more additional capacitors can also be employed. Additionally, although the reactive elements $220_{ij}$ are all shown as capacitors in FIG. 2, in some embodiments, one or more inductors can be employed in addition to and/or in place of these capacitors.

Figure 3:
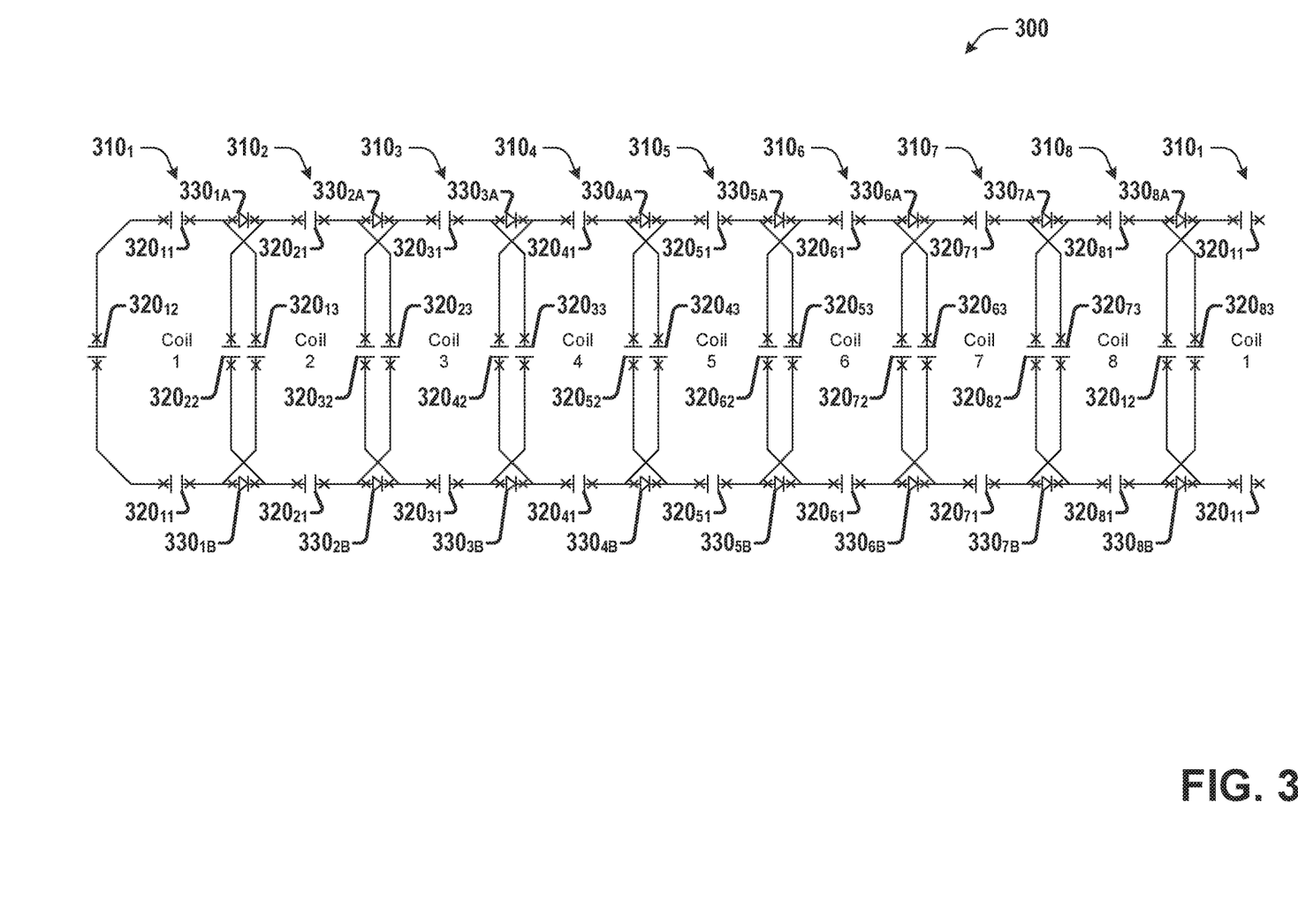
FIG. 3 is a diagram illustrating a first example row of a MRI coil or coil array comprising eight channels connected via diodes and as an 8-rung birdcage coil, according to various embodiments discussed herein.

In the Tx mode, multiple diodes (e.g., PIN diodes or cross signal diodes, etc.) can be used to connect the n (e.g., 8, etc.) coil elements of a row as an n-rung (e.g., 8-rung) birdcage coil. Referring to FIG. 3, illustrated is a diagram showing a first example row 300 of a MRI coil or coil array comprising eight channels $310_i$ connected via diodes $330_{iA}$ and $330_{iB}$ as an 8-rung birdcage coil, according to various embodiments discussed herein. In FIG. 3, diodes $330_{iA}$ (forming the top ring (relative to FIG. 3, but independent of actual orientation) of the two end rings of the birdcage coil) and $330_{iB}$ (forming the bottom ring (relative to FIG. 3, but independent of actual orientation) of the two end rings of the birdcage coil). For ease of illustration, RF chokes and other components that can be used for controlling the PIN diodes $330_{iA}$ and $330_{iB}$ are not shown in FIG. 3. Additionally, in example row 300 (and in other rows, coils, and coil arrays discussed herein), although, for ease of illustration, single diodes $330_{iA}$ and $330_{iB}$ are shown at each location in row 300 having a diode, in various embodiments, each of these locations can comprise, for example, a single PIN diode, a pair of cross signal diodes, or a pair of back-to-back PIN diodes, etc.

Figure 4:
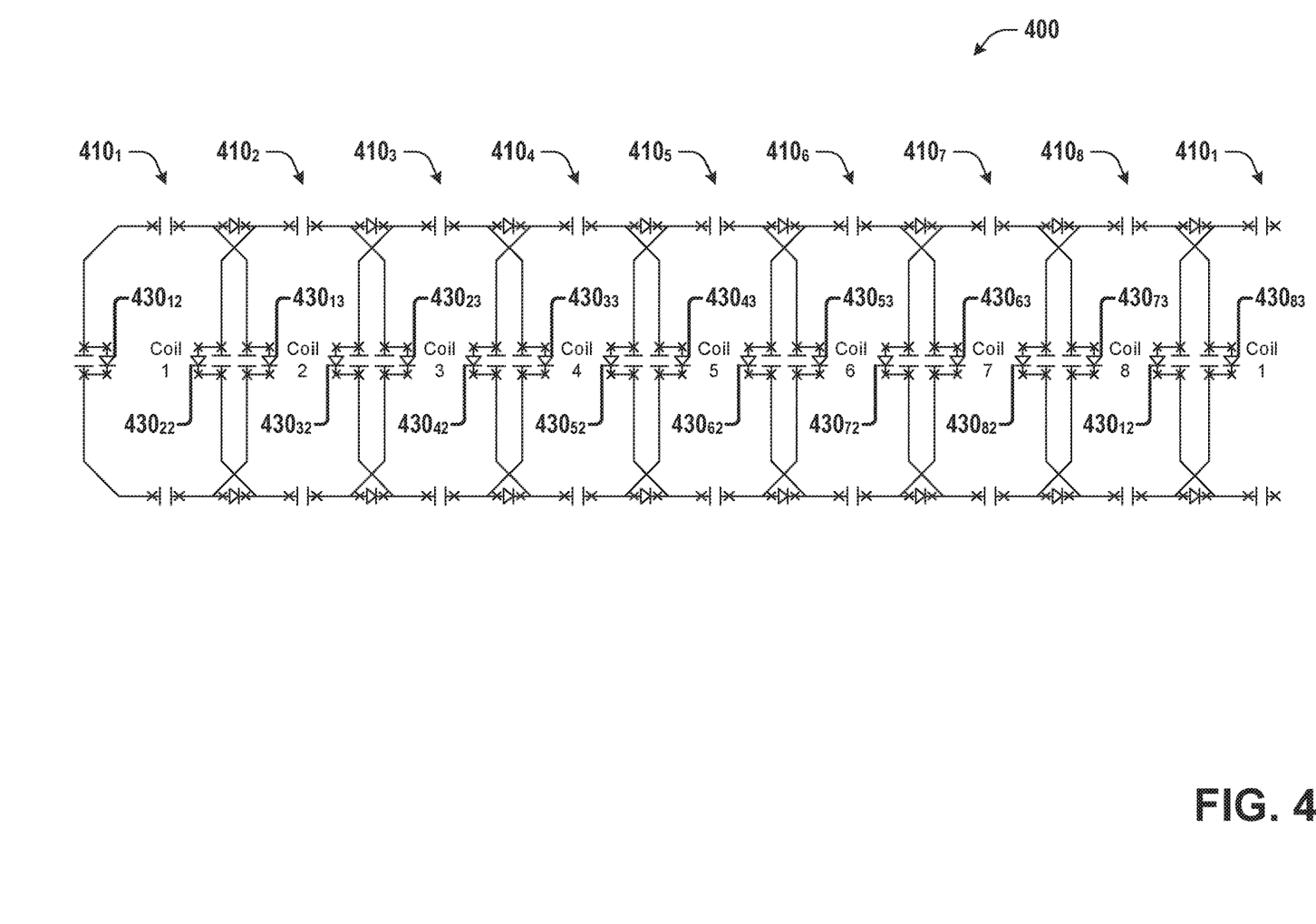
FIG. 4 is a diagram illustrating an example row of a MRI coil or coil array comprising eight channels connected via diodes as a high-pass 8-rung birdcage coil, according to various embodiments discussed herein.
Figure 5:
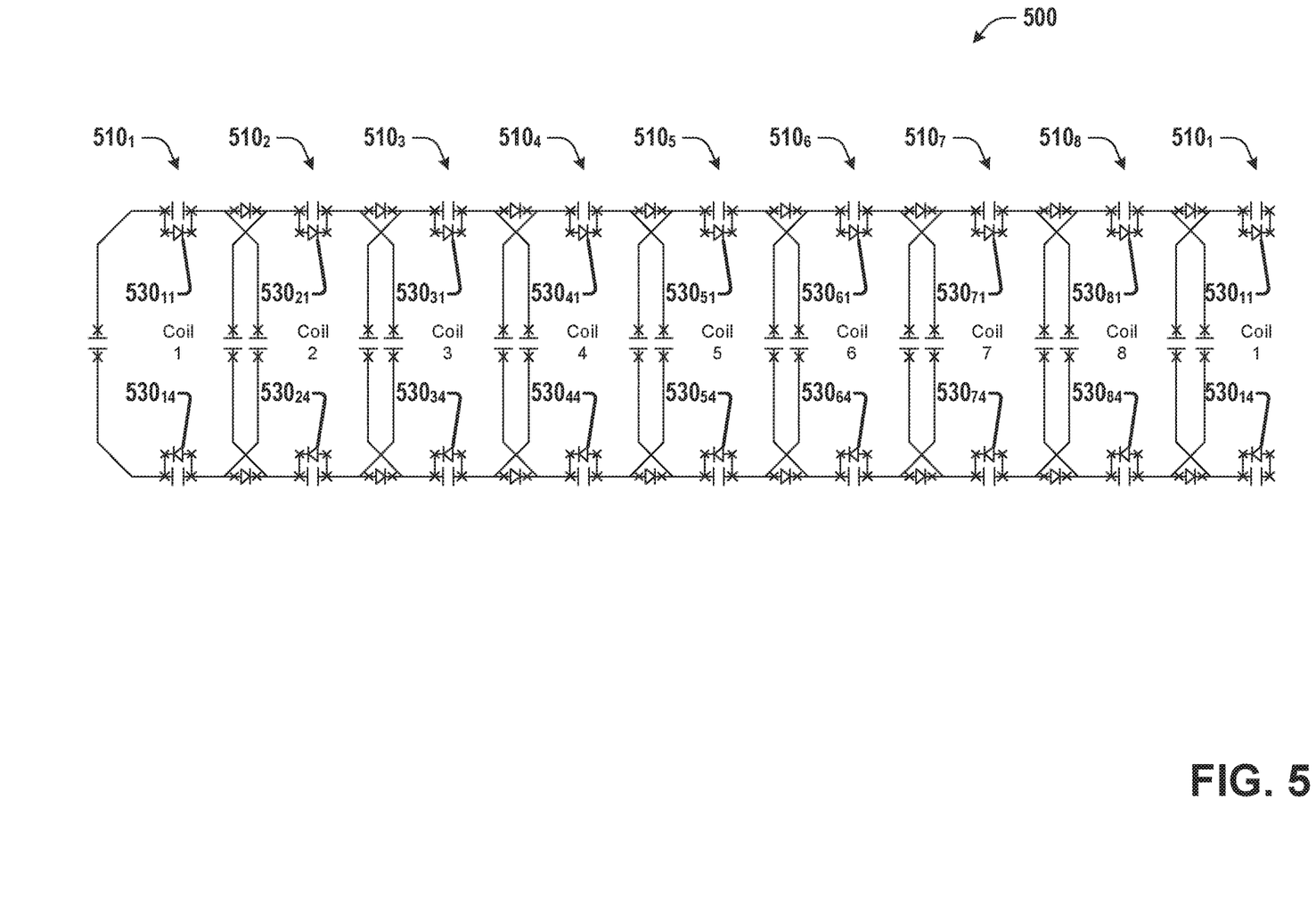
FIG. 5 is a diagram illustrating an example row of a MRI coil or coil array comprising eight channels connected via diodes as a low-pass 8-rung birdcage coil, according to various embodiments discussed herein.

Considering, for example, the overlap area between coil element 3101 and 3102, the two PIN diodes 3301A and 3301B between the two coil elements create two copper traces (etc.) in parallel. As a result, these two traces (etc.) create one birdcage rung. Overall, row 300 creates a hybrid 8-rung birdcage coil. FIG. 3 only shows one possible example out of multiple approaches of a birdcage coil that can be formed from a row using multiple diodes. Referring to FIG. 4, illustrated is a diagram showing an example row 400 of a MRI coil or coil array comprising eight channels $410_i$ connected via diodes $430_{iA}$, $430_{iB}$, $430_{i2}$, and $430_{i3}$ as a high-pass 8-rung birdcage coil, according to various embodiments discussed herein. Referring to FIG. 5, illustrated is a diagram showing an example row 500 of a MRI coil or coil array comprising eight channels $510_i$ connected via diodes $530_{iA}$, $530_{iB}$, $530_{i1}$, and $530_{i4}$ as a low-pass 8-rung birdcage coil, according to various embodiments discussed herein. In FIGS. 4 and 5, diodes $430_{i2}$, $430_{i3}$, $530_{i1}$ and $530_{i4}$ can be arranged in parallel across the corresponding capacitors $420_{i2}$, $420_{i3}$, $520_{i1}$ and $520_{i4}$, respectively, per the subscript labeling used in FIGS. 2 and 3 (for ease of illustration, these labels are only shown for capacitors of coil elements $410_1$ in FIGS. 4 and $510_1$ in FIG. 5) and discussed herein.

Regardless of the approach used for the birdcage coil (e.g., hybrid, high-pass, low-pass, etc.), each coil element (e.g., $310_i$, $410_i$, or $510_i$) can be tuned to the working frequency in Rx mode, and the birdcage frequency can be tuned to the working frequency or some other frequency in Tx mode. This independent coil tuning in Tx and Rx mode can be accomplished via independent coil capacitance or inductance change in Tx and Rx mode. This independent impedance change can be achieved in a variety of ways, for example, by adjusting capacitors in parallel with PIN diodes (e.g., capacitors $420_{i2}$, $420_{i3}$, $520_{i1}$ and/or $520_{i4}$) and capacitors not in parallel with PIN diodes (e.g., capacitors $420_{i1}$, $420_{i4}$, $520_{i2}$ and/or $520_{i3}$). As one specific example, in FIG. 4, the capacitance of capacitors $420_{i1}$ and $420_{i4}$ can be adjusted for the birdcage frequency in Tx mode. Capacitors $420_{i2}$ and $420_{i3}$ are in parallel with PIN diodes; therefore, their values cannot change the tuning frequency of the birdcage in Tx mode, but can be used to change the tuning frequency of each coil element in Rx mode. In some scenarios, the capacitors in parallel with diodes (e.g., capacitors $420_{i2}$, $420_{i3}$, $520_{i1}$ and/or $520_{i4}$) can be replaced with inductors.

In the example embodiment of a 3-row, 24-channel coil, a birdcage coil similar to one of FIG. 3, FIG. 4, or FIG. 5 can be employed as the middle row. Each of the other two rows of this example coil can either (a) be made into a birdcage coil using multiple PIN diodes, wherein that birdcage coil is inductively coupled to the first birdcage coil (e.g., the center row), or (b) can have separate coil elements that are not formed into a birdcage coil, wherein each coil element of that row is inductively coupled to the first birdcage directly in Tx mode. When the other two rows are inductively coupled to the first birdcage, a new expanded-row uniform mode or an expanded multiple-row birdcage coil is created through the inductive coupling between rows.

If the expanded row uniform mode frequency or the expanded multiple-row birdcage coil frequency is set to be the same as the working frequency in Tx mode, then this expanded mode/coil can be driven, either through a direct connection or inductive coupling to the WBC in Tx mode, for a uniform Tx field. If the expanded mode/coil is driven through a direct connection, the driving can be through one of the one-row birdcages. It can be driven in a variety of ways, for example, through one port, two ports in quadrature, etc., in Tx mode. In Rx mode, the coil becomes a standard array coil since PIN diodes are considered open in Rx mode.

Figure 6:
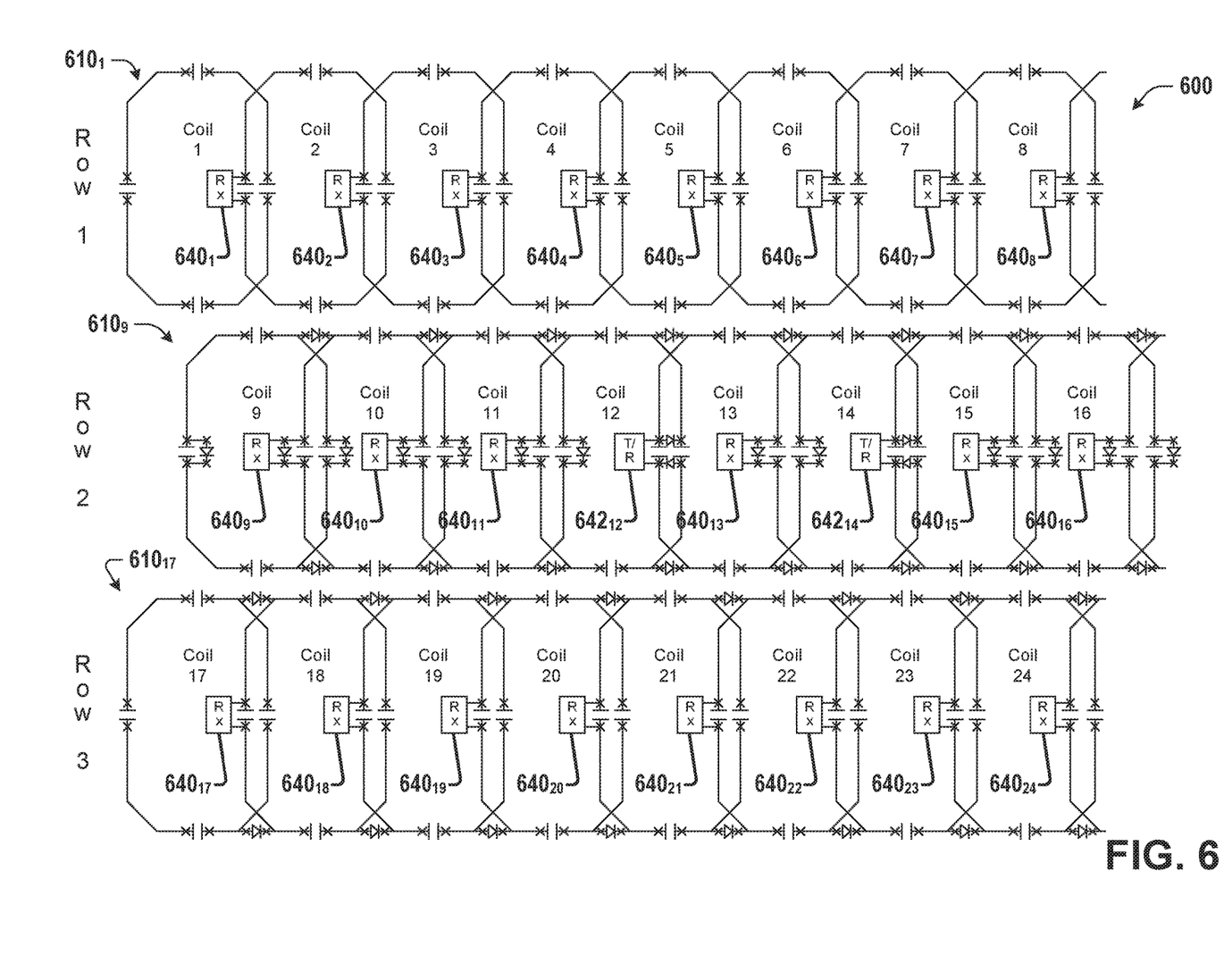
FIG. 6 is a diagram illustrating an example embodiment of a three-row, 24-channel coil or coil array configured to operate alternately in a Transmit (Tx) mode or a Receive (Rx) mode, according to various embodiments discussed herein.

Referring to FIG. 6, illustrated is an example embodiment of a three-row, 24-channel coil or coil array 600 configured to operate alternately in a Tx mode or an Rx mode, according to various embodiments discussed herein. Coil 600 shows an example of a coil driven using a direct connection, with the driving through row 2, and in particular via coil elements $610_{12}$ and $610_{14}$ in quadrature through Tx/Rx circuitry $642_{12}$ and $642_{14}$, respectively (wherein coil elements of coil 600 are denoted as $610_i$, although for ease of illustration, only coil elements 1 ($610_1$), 9 ($610_9$), and 17 ($610_{17}$) of coil elements $610_i$ have labeling included in FIG. 6). Each other coil element $610_i$ can be connected to associated Rx circuitry $640_i$.

Figure 7:
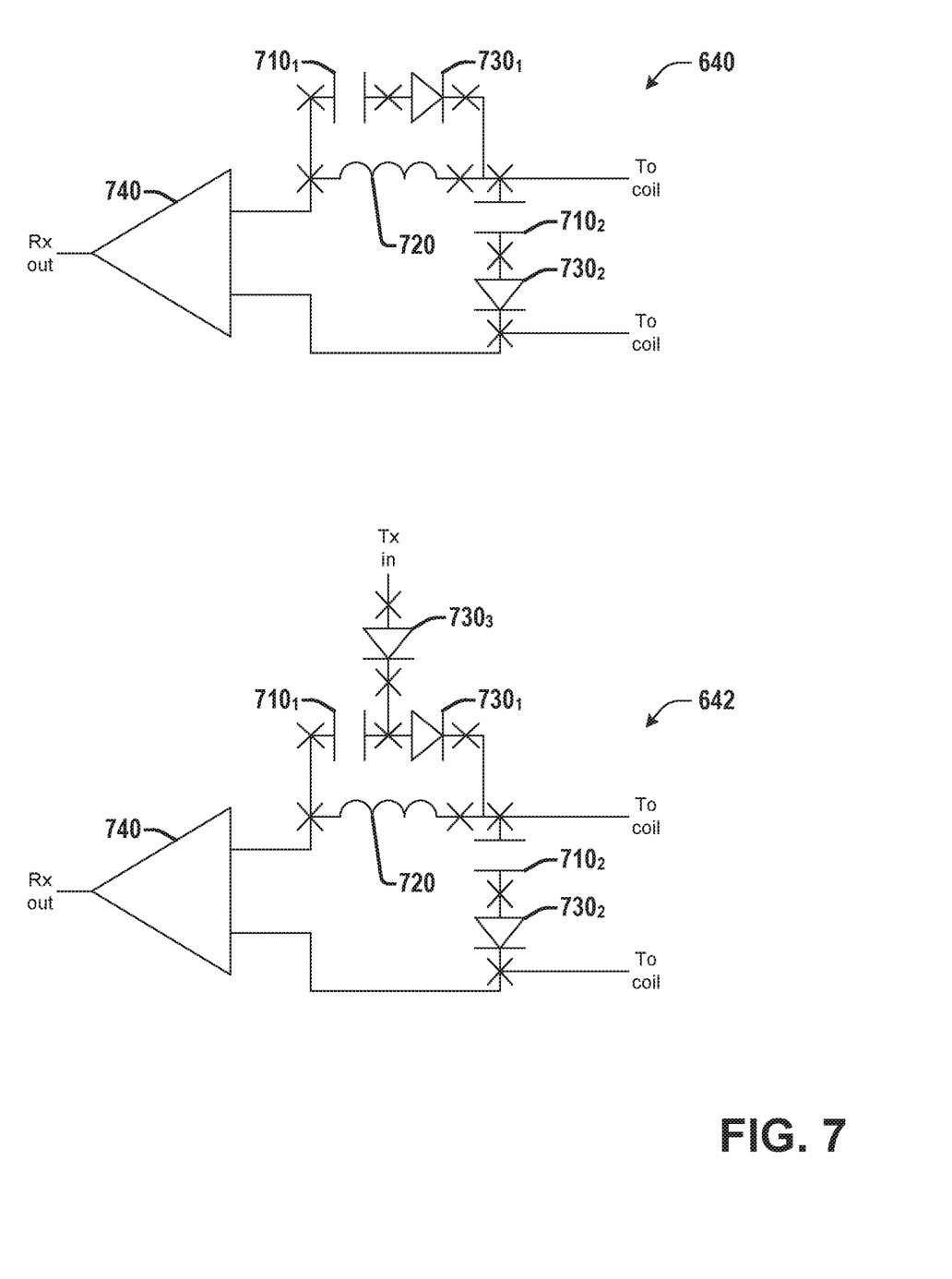
FIG. 7 is a diagram illustrating are example circuits that can be employed for Rx circuitry and Tx/Rx circuitry, in connection with various embodiments discussed herein.

Referring to FIG. 7, illustrated are example circuits that can be employed for Rx circuitry 640 and Tx/Rx circuitry 642, in connection with various embodiments discussed herein. It is to be appreciated that while FIG. 7 shows specific example circuits (e.g., comprising specific arrangements of capacitors $710_i$, inductors $720_i$, diodes $730_i$, and preamplifiers $740_i$, etc.) that can be employed as Rx circuitry 640 or Tx/Rx circuitry 642, any of a variety of other circuits can be employed as Rx circuitry or Tx/Rx circuitry in connection with various embodiments.

Referring again to FIG. 6, row 2 (coil elements $610_9$-$610_{16}$) is a birdcage in Tx mode, and is driven at coil elements $610_{12}$ and $610_{14}$ via Tx/Rx circuitry $642_{12}$ and $642_{14}$, respectively. In various aspects, a row (e.g., like row 2) that, in the Tx mode, is either driven with a Tx signal via direct electrical connection or via inductively coupling to a WBC can be referred to as a "primary row" (wherein each primary row can be configured as a birdcage coil in the Tx mode).

Row 1 (coil elements $610_1$-$610_8$) is not configured as a birdcage coil, and coil elements $610_1$-$610_8$ directly couple to the row 2 birdcage in Tx mode. Row 3 (coil elements $610_{17}$-$610_{24}$), like row 2, is configured as a birdcage in Tx mode, and it couples to row 2 inductively. In various aspects, a row (like row 1 or row 3) that is not a primary row but which inductively couples to a primary row in the Tx mode can be referred to as a "secondary row" (wherein, in the Tx mode, each primary row can be configured as a birdcage coil (e.g., like row 3) or as individual coil elements (e.g., like row 1)).

In coil 600, all three rows together create an expanded uniform mode covering all rows in Tx mode (e.g., a common mode for all of the rows). As discussed above, in various embodiments, row 3 can be individual coil elements not forming a birdcage and/or row 1 can be configured as a birdcage. As long as there is one birdcage-like row (e.g., row 2), the other rows can couple to that birdcage row inductively. Additionally, rows other than a driving row, such as row 1 and row 3 in FIG. 6, can have a number of coil elements that are the same as or different from those of the driving row (e.g., 4 or more coil elements, for example, 5, 10, etc.), which provides additional flexibility for coil design.

Additionally, a coil according to aspects discussed herein (e.g., coil 600, etc.) can be used together with another receiving coil to provide a unique SLT and Rx coil. As one example embodiment, a cylindrical-like head SLT coil (which can operate as a Tx/Rx coil, like row 2 in coil 600) can be combined with a neck and spine Rx-only coil to work together as one combined coil. This combined coil can provide multiple advantages, including supporting several unique functions with an improved workflow for an operator. For head only imaging, the coil can be simply used as a SLT head only coil by using a decoupling circuit to disable neck and spine coil. Because of the smaller SAR from the SLT head coil, acceleration techniques can be used in Tx mode to reduce scan time. This is one workflow improvement. For head/neck imaging, the SLT head coil can be used as a standard Rx coil, and the whole set of head, neck and spine coils can perform the function of a head/neck coil. This is also a workflow improvement.

The SLT head coil can be adapted to a Rx head coil through PIN diode control (similar techniques can be employed for other SLT embodiments). For example, each PIN diode can be replaced with a back to back PIN diode pair, which can ensure the PIN diodes can only be turned on by the controlling DC current, and not by a high power B1 field from the WBC. For this reason, the breakdown voltage of the PIN diode should be greater than the maximum induced voltage from the WBC. Second, at least one decoupling circuit can be added for each element using PIN diodes. Bac-to-back PIN diodes can be employed in each decoupling circuit to ensure it can only be turned on by the controlling DC current. Thus, two groups of PIN diodes can be employed for SLT elements: a first group for SLT Tx, and a second group for Tx decoupling. In SLT Tx mode, the SLT PIN diode group can be turned ON (e.g., shorted), but Tx decoupling PIN diode group can be kept OFF (e.g., open). Then each element will resonate, and Tx decoupling will not be ON because of the back to back diodes, which can provide SLT functionality. In order to use the coil as a standard Rx coil (e.g., and not operating in Tx mode), the SLT PIN diode can be kept always OFF regardless of Tx or Rx mode, and Tx decoupling PIN diode can be turned ON in Tx mode and OFF in Rx mode. The operation of these groups of PIN diodes (e.g., the first group for SLT Tx and the second group for Tx decoupling) for each of the SLT mode, traditional Tx mode and Rx mode arrangements are summarized in Table 1 as follows:

TABLE 1

PIN diodes control table for different modes if a
SLT coil works with other Rx coils
(Note: ON means diodes short and OFF means open)

| | Back to back PIN diodes | SLT Tx mode (WBC ON with high Tx power) | Traditional Tx mode (WBC ON with high Tx power) | Rx mode (WBC OFF without any RF power) |
|---|---|---|---|---|
| SLT coil, such as head | SLT PIN diodes | ON | Not Applicable | OFF |
| | Decoupling diodes | OFF | ON | OFF |
| Other Rx coils, such as neck and spine | Decoupling diodes | ON | ON | OFF |

For purposes of illustration, example embodiments have been discussed, such as various embodiments of a coil comprising three rows (e.g., coil 600), with the center row driven via a Tx signal received via an electrical connection (e.g., via Tx/Rx circuitry $642_{12}$ and $642_{14}$ in quadrature). However, in general, various embodiments can comprise a m-row coil, wherein m is an integer greater than one, with at least one row configured as a primary row, such that, in a Tx mode, it is configured to generate a local Tx field either through inductive coupling to a WBC or via an electrical connection to a Tx signal, and (when driven via direct connection) with at least one row configured as a secondary row that inductively couples to one or more primary rows (when driven via inductive coupling to a WBC, each row can inductively couple to the WBC, and at least one of the rows can be configured as a birdcage coil in the Tx mode). Each row can have four or more coil elements, and different rows can have the same or different numbers of coil elements. Each of the rows can be arranged radially around a cylindrical axis (e.g., with coil elements of that row circumferentially enclosing the cylindrical axis), and adjacent rows can be longitudinally offset from each along the cylindrical axis (e.g., with one of partial overlap, no overlap, some amount of underlap (e.g., a gap between rows), etc.). Additionally, adjacent rows can be rotationally offset relative to each other (e.g., by a given fraction of the width of a coil element (e.g., half, etc.) when they have the same number of coil elements, or such that no coil elements in adjacent rows are rotationally aligned when they have the same or different numbers of coil elements, etc.) or can be rotationally aligned relative to each other.

In the Rx mode, each coil element can separately resonate at the working frequency. In the Tx mode, the primary and secondary rows of the coil can be inductively coupled together and collectively create an expanded uniform mode (e.g., a common mode for all of the rows) that resonates at an expanded uniform mode frequency, which can be set in the Tx mode to be the working frequency. Because non-adjacent rows will not strongly couple, in various embodiments, each of the m rows of a coil according to various embodiments can be configured to be one of a primary row (e.g., and thus also configured as a birdcage coil in the Tx mode) or a secondary row (e.g., and configured as one of a birdcage coil or as individual coil elements in the Tx mode) that is adjacent to a primary row. Alternatively, in some embodiments, a coil can comprise one or more primary rows, one or more secondary rows, and at least one row (e.g., not adjacent to a primary row, etc.) that is only configured to operate in the Rx mode.

Examples herein can include subject matter such as a method, means for performing acts or blocks of the method, at least one machine-readable medium including executable instructions that, when performed by a machine (e.g., MRI machine, for example as described herein, etc.) cause the machine to perform acts of the method or of an apparatus or system according to embodiments and examples described.

A first example embodiment comprises a single-layer multi-row magnetic resonance imaging (MRI) radio frequency (RF) coil array configured to operate in a transmit (Tx) mode or in a receive (Rx) mode on a cylindrical-like former, the MRI RF coil array comprising: at least two rows of RF coil elements, wherein each row is arranged radially around a cylindrical axis, wherein at least one row comprises: at least four RF coil elements of that row circumferentially enclosing the cylindrical axis, wherein each RF coil element of the at least four RF coil elements of that row is configured to operate in a Tx mode and in a Rx mode, wherein, in the Rx mode, each RF coil element of the at least four RF coil elements of that row is tuned to a working frequency of the MRI RF coil array, wherein, in the Tx mode, all RF coil elements of the at least four RF coil elements of that row are linked using diodes to create a first birdcage coil and this birdcage coil inductively couples to other rows to generate transmitting field to cover all rows at the working frequency.

A second example embodiment comprises the first example embodiment, wherein in the Tx mode, each of the other rows of the coil array can be either linked using diodes to create a birdcage-like coil and the new birdcage-like coil inductively couples to the first birdcage-like coil for generating the transmitting field covering the first birdcage row and the other rows, or each element of the row inductively couples to the first birdcage-like coil for generating the transmitting field covering the first birdcage row and the other rows.

A third example embodiment comprises the first example embodiment, wherein the cylindrical axis is of a cylindrical former for at least one of a head anatomy, a knee anatomy, a leg anatomy, or a wrist anatomy.

A fourth example embodiment comprises the first example embodiment, wherein, in the Tx mode, at least one birdcage row is driven at the working frequency via an electrical connection to a power supply.

A fifth example embodiment comprises the fourth example embodiment, wherein the at least one birdcage row is driven in quadrature ports.

A sixth example embodiment comprises the fourth example embodiment, wherein the at least one birdcage row is driven in one port.

A seventh example embodiment comprises the first example embodiment, wherein, in the Tx mode, is driven at the working frequency by the whole body coil using inductive coupling.

An eighth example embodiment comprises the first example embodiment, wherein, for each row, each RF coil element of the at least four RF coil elements of that row has partial overlaps with two neighboring RF coil elements of the at least four RF coil elements of that row, wherein the partial overlaps minimize coupling between that RF coil element and the two neighboring RF coil elements.

A ninth example embodiment comprises the first example embodiment, wherein the at least one row comprises a first row and a second row that has different element number than the first row, wherein the first row is longitudinally offset from the second row along the cylindrical axis.

A tenth example embodiment comprises the first example embodiment, wherein each RF coil element of the first row has at least one partial overlap with at least one associated RF coil element of the second row, wherein the at least one partial overlap minimizes coupling between that RF coil element and the at least one associated RF coil element of the second row.

An eleventh example embodiment comprises the first example embodiment, wherein each of the diodes can be a PIN diode.

A twelfth example embodiment comprises the first example embodiment, wherein each of the diodes can be a pair of cross signal diodes.

A thirteenth example embodiment comprises the first example embodiment, wherein each of the diodes can be a pair of back to back PIN diodes.

A fourteenth example embodiment comprises the first example embodiment, wherein the coil is configured to be used together with a second Rx only coil as a traditional Rx coil.

The following examples are additional embodiments.

Example 1 is a magnetic resonance imaging (MRI) radio frequency (RF) coil array configured to operate in at least one of a transmit (Tx) mode or a receive (Rx) mode on a cylindrical former, the MRI RF coil array comprising: two or more rows of RF coil elements, wherein each row of the two or more rows of coil elements comprises at least four RF coil elements of that row that circumferentially enclose a cylindrical axis, wherein the two or more rows of RF coil elements comprise: at least one primary row of RF coil elements, wherein, each primary row of the at least one primary row of RF coil elements comprises a plurality of diodes of that primary row that connect each RF coil element of the at least four RF coil elements of that primary row to two neighboring RF coil elements of that RF coil element on a first end loop of that primary row and on a second end loop of that primary row, wherein, in the Tx mode, the plurality of diodes of that primary row are configured to link the at least four RF coil elements of that primary row to create an associated birdcage coil for that primary row, wherein, in the Rx mode, each RF coil element of each of the two or more rows RF coil elements is configured to be tuned to a working frequency of the MRI RF coil array, and wherein, in the Tx mode, the two or more rows of RF coil elements are configured to inductively couple together to generate a Tx field at the working frequency.

Example 2 comprises the subject matter of any variation of any of example(s) 1, wherein the two or more rows of RF coil elements comprise at least one secondary row of RF coil elements, wherein a first secondary row of the at least one secondary row comprises a plurality of diodes of the first secondary row that connect each RF coil element of the at least four RF coil elements of the first secondary row to two neighboring RF coil elements of the at least four RF coil elements on a first end loop of the first secondary row and on a second end loop of the first secondary row, wherein, in the Tx mode, the plurality of diodes of the first secondary row are configured to link the at least four RF coil elements of the first secondary row to create an associated birdcage coil for the first secondary row.

Example 3 comprises the subject matter of any variation of any of example(s) 1-2, wherein the two or more rows of RF coil elements comprise at least one secondary row of RF coil elements, wherein, in the Tx mode, each RF coil element of the at least four RF coil elements of a second secondary row of the at least one secondary row is configured to individually inductively couple to a primary coil of the at least one primary coil to generate the Tx field at the working frequency.

Example 4 comprises the subject matter of any variation of any of example(s) 1-3, wherein the cylindrical axis is the cylindrical axis of the cylindrical former, and wherein the cylindrical former is associated with one or more of a head anatomy, a knee anatomy, a leg anatomy, or a wrist anatomy.

Example 5 comprises the subject matter of any variation of any of example(s) 1-4, wherein, in the Tx mode, a first primary row of the at least one primary row is configured to be driven at the working frequency via at least one electrical connection to a power supply.

Example 6 comprises the subject matter of any variation of any of example(s) 5, wherein, in the Tx mode, the first primary coil of the at least one primary row is configured to be driven via a single RF coil element of the at least four RF coil elements of the first primary row.

Example 7 comprises the subject matter of any variation of any of example(s) 5, wherein, in the Tx mode, the first primary coil of the at least one primary row is configured to be driven in quadrature via two RF coil elements of the at least four RF coil elements of the first primary row.

Example 8 comprises the subject matter of any variation of any of example(s) 1-4, wherein, in the Tx mode, the two or more rows of RF coil elements are configured to be driven at the working frequency via inductive coupling to a whole body coil (WBC).

Example 9 comprises the subject matter of any variation of any of example(s) 1-8, wherein, for each row of the two or more rows of RF coil elements, each RF coil element of the at least four RF coil elements of that row has a partial overlap with the two neighboring RF coil elements of that RF coil element, wherein the partial overlap minimizes coupling between that RF coil element and the two neighboring RF coil elements of that RF coil element.

Example 10 comprises the subject matter of any variation of any of example(s) 1-9, wherein the two or more rows of RF coil elements comprise a first row of RF coil elements that comprises a first number of RF coil elements and a second row of RF coil elements that comprises a second number of RF coil elements, wherein the first number is different from the second number, and wherein the first row is longitudinally offset from the second row along the cylindrical axis.

Example 11 comprises the subject matter of any variation of any of example(s) 1-10, wherein the two or more rows of RF coil elements comprise a first row of RF coil elements and a second row of RF coil elements, wherein the first row is longitudinally offset from the second row along the cylindrical axis, and wherein each RF coil element of the at least four RF coil elements of the first row has a partial overlap with one or more RF coil elements of the at least four RF coil elements of the second row, wherein the partial overlap minimizes coupling between that RF coil element and the one or more RF coil elements of the at least four RF coil elements of the second row.

Example 12 comprises the subject matter of any variation of any of example(s) 1-11, wherein, for a first primary row of the at least one primary row, the plurality of diodes of that primary row comprise, for each RF coil element of the at least four RF coil elements of that primary row, a first PIN diode that connects that RF coil element to a first neighboring RF coil element of the two neighboring RF coil elements of that RF coil element on the first end loop of that primary row and a second PIN diode that connects that RF coil element to the first neighboring RF coil element of the two neighboring RF coil elements of that RF coil element on the second end loop of that primary row.

Example 13 comprises the subject matter of any variation of any of example(s) 1-11, wherein, for a first primary row of the at least one primary row, the plurality of diodes of that primary row comprise, for each RF coil element of the at least four RF coil elements of that primary row, a first pair of cross signal diodes that connects that RF coil element to a first neighboring RF coil element of the two neighboring RF coil elements of that RF coil element on the first end loop of that primary row and a second pair of cross signal diodes that connects that RF coil element to the first neighboring RF coil element of the two neighboring RF coil elements of that RF coil element on the second end loop of that primary row.

Example 14 comprises the subject matter of any variation of any of example(s) 1-11, wherein, for a first primary row of the at least one primary row, the plurality of diodes of that primary row comprise, for each RF coil element of the at least four RF coil elements of that primary row, a first pair of back-to-back PIN diodes that connects that RF coil element to a first neighboring RF coil element of the two neighboring RF coil elements of that RF coil element on the first end loop of that primary row and a second pair of back-to-back PIN diodes that connects that RF coil element to the first neighboring RF coil element of the two neighboring RF coil elements of that RF coil element on the second end loop of that primary row.

Example 15 is a magnetic resonance imaging (MRI) system, comprising: a MRI radio frequency (RF) coil array configured to operate in at least one of a transmit (Tx) mode or a receive (Rx) mode on a cylindrical former, the MRI RF coil array comprising: two or more rows of RF coil elements, wherein each row of the two or more rows of coil elements comprises at least four RF coil elements of that row that circumferentially enclose a cylindrical axis, wherein the two or more rows of RF coil elements comprise: at least one primary row of RF coil elements, wherein, each primary row of the at least one primary row of RF coil elements comprises a plurality of diodes of that primary row that connect each RF coil element of the at least four RF coil elements of that primary row to two neighboring RF coil elements of that RF coil element on a first end loop of that primary row and on a second end loop of that primary row, wherein, in the Tx mode, the plurality of diodes of that primary row are configured to link the at least four RF coil elements of that primary row to create a birdcage coil for that primary row, wherein, in the Rx mode, each RF coil element of each of the two or more rows RF coil elements is configured to be tuned to a working frequency of the MRI RF coil array, and wherein, in the Tx mode, the two or more rows of RF coil elements are configured to inductively couple together to generate a Tx field at the working frequency.

Example 16 comprises the subject matter of any variation of any of example(s) 15, wherein, in the Tx mode, a first primary row of the at least one primary row is configured to be driven at the working frequency via at least one electrical connection to a power supply.

Example 17 comprises the subject matter of any variation of any of example(s) 15, wherein, in the Tx mode, the two or more rows of RF coil elements are configured to be driven at the working frequency via inductive coupling to a whole body coil (WBC).

Example 18 is a magnetic resonance imaging (MRI) radio frequency (RF) coil array configured to operate in at least one of a transmit (Tx) mode or a receive (Rx) mode on a cylindrical former, the MRI RF coil array comprising: two or more rows of RF coil elements, wherein each row of the two or more rows of coil elements comprises at least four RF coil elements of that row that circumferentially enclose a cylindrical axis, wherein the two or more rows of RF coil elements comprise: at least one primary row of RF coil elements, wherein, each primary row of the at least one primary row of RF coil elements comprises a plurality of diodes of that primary row that connect each RF coil element of the at least four RF coil elements of that primary row to two neighboring RF coil elements of that RF coil element on a first end loop of that primary row and on a second end loop of that primary row, wherein, in the Tx mode, the plurality of diodes of that primary row are configured to link the at least four RF coil elements of that primary row to create an associated birdcage coil for that primary row, wherein, in the Rx mode, each RF coil element of each of the two or more rows RF coil elements is configured to be tuned to a working frequency of the MRI RF coil array, and wherein, in the Tx mode, the plurality of diodes are configured to selectively operate according to one of a plurality of configurations, wherein in a first configuration the plurality of diodes decouple the at least one primary row, and wherein in a second configuration the plurality of diodes are configured to cause the at least one primary row of RF coil elements to be driven at the working frequency such that the two or more rows of RF coil elements are inductively coupled together to generate a Tx field at the working frequency.

Example 19 comprises the subject matter of any variation of any of example(s) 18, wherein the two or more rows of RF coil elements comprise at least one secondary row of RF coil elements, wherein a first secondary row of the at least one secondary row comprises a plurality of diodes of the first secondary row that connect each RF coil element of the at least four RF coil elements of the first secondary row to two neighboring RF coil elements of the at least four RF coil elements on a first end loop of the first secondary row and on a second end loop of the first secondary row, wherein, in the Tx mode, the plurality of diodes of the first secondary row are configured to link the at least four RF coil elements of the first secondary row to create an associated birdcage coil for the first secondary row.

Example 20 comprises the subject matter of any variation of any of example(s) 18-19, wherein the two or more rows of RF coil elements comprise at least one secondary row of RF coil elements, wherein, in the Tx mode, in the second configuration, each RF coil element of the at least four RF coil elements of a second secondary row of the at least one secondary row is configured to individually inductively couple to a primary coil of the at least one primary coil to generate the Tx field at the working frequency.

Example 21 is a MRI apparatus comprising a MRI RF coil according to any variation of any of example(s) 1-20.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the disclosure and appended claims. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "various embodiments," "one example", "an example", or "various examples" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrases "in one embodiment" or "in various embodiments" does not necessarily refer to the same embodiment(s), though it may.

"Circuit", as used herein, includes but is not limited to hardware, firmware, or combinations of each to perform a function(s) or an action(s), or to cause a function or action from another circuit, logic, method, or system. A circuit can include a software controlled microprocessor, a discrete logic (e.g., ASIC), an analog circuit, a digital circuit, a programmed logic device, a memory device containing instructions, and other physical devices. A circuit can include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical circuit between multiple physical circuits.

"Computer-readable storage device", as used herein, refers to a device that stores instructions or data. "Computer-readable storage device" does not refer to propagated signals. A computer-readable storage device can take forms, including, but not limited to, non-volatile media, and volatile media. Non-volatile media can include, for example, optical disks, magnetic disks, tapes, and other media. Volatile media can include, for example, semiconductor memories, dynamic memory, and other media. Common forms of a computer-readable storage device can include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store can store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

A set of elements or a set of other components can be described herein, in which the term "set" can be interpreted as "one or more," unless the context indicates otherwise (e.g., "the empty set," "a set of two or more Xs," etc.).

Additionally, in situations wherein one or more numbered items are discussed (e.g., a "first X", a "second X", etc.), in general the one or more numbered items can be distinct or they can be the same, although in some situations the context may indicate that they are distinct or that they are the same.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature can be combined with one or more other features of the other implementations as may be desired and advantageous for any given or particular application.

What is claimed is:

1. A magnetic resonance imaging (MRI) radio frequency (RF) coil array configured to operate in at least one of a transmit (Tx) mode or a receive (Rx) mode on a cylindrical former, the MRI RF coil array comprising:
   two or more rows of RF coil elements, wherein each row of the two or more rows of RF coil elements comprises at least four RF coil elements of that row that circumferentially enclose a cylindrical axis, wherein the two or more rows of RF coil elements comprise:
      at least one primary row of RF coil elements, wherein each primary row of the at least one primary row of RF coil elements comprises a plurality of diodes of that primary row that connect each RF coil element of the at least four RF coil elements of that primary row to two neighboring RF coil elements of that RF coil element on a first end loop of that primary row and on a second end loop of that primary row, wherein, in the Tx mode, the plurality of diodes of that primary row are configured to link the at least four RF coil elements of that primary row to create an associated birdcage coil for that primary row, and wherein the at least one primary row comprises a first primary row;
      a first secondary row, wherein the first secondary row borders and is longitudinally offset from the first primary row, and wherein the at least four RF coil elements of the first secondary row are configured to individually inductively couple as separate coils to the first primary row, and without being linked into a birdcage coil by diodes, in the Tx mode;
   wherein, in the Rx mode, each RF coil element of each of the two or more rows of RF coil elements is configured to be tuned to a working frequency of the MRI RF coil array, and
   wherein, in the Tx mode, the two or more rows of RF coil elements are configured to inductively couple together to generate a Tx field at the working frequency.

2. The MRI RF coil array of claim 1, wherein the two or more rows of RF coil elements comprise a second secondary row, wherein the second secondary row comprises a plurality of diodes of the second secondary row that connect each RF coil element of the at least four RF coil elements of the second secondary row to two neighboring RF coil elements of the at least four RF coil elements on a first end loop of the second secondary row and on a second end loop of the second secondary row, wherein, in the Tx mode, the plurality of diodes of the second secondary row are configured to link the at least four RF coil elements of the second secondary row to create an associated birdcage coil for the second secondary row.

3. The MRI RF coil array of claim 1, wherein the cylindrical axis is a cylindrical axis of the cylindrical former, and wherein the cylindrical former is associated with one or more of a head anatomy, a knee anatomy, a leg anatomy, or a wrist anatomy.

4. The MRI RF coil array of claim 1, wherein, in the Tx mode, the first primary row of the at least one primary row is configured to be driven via a single RF coil element of the at least four RF coil elements of the first primary row.

5. The MRI RF coil array of claim 1, wherein, in the Tx mode, the first primary row of the at least one primary row is configured to be driven in quadrature via two RF coil elements of the at least four RF coil elements of the first primary row.

6. The MRI RF coil array of claim 1, wherein, in the Tx mode, the two or more rows of RF coil elements are configured to be driven at the working frequency via inductive coupling to a whole body coil (WBC).

7. The MRI RF coil array of claim 1, wherein, for each row of the two or more rows of RF coil elements, each RF coil element of the at least four RF coil elements of that row has a partial overlap with the two neighboring RF coil elements of that RF coil element, wherein the partial overlap minimizes coupling between that RF coil element and the two neighboring RF coil elements of that RF coil element.

8. The MRI RF coil array of claim 1, wherein the two or more rows of RF coil elements comprise a first row of RF coil elements and a second row of RF coil elements, wherein the first row is longitudinally offset from the second row along the cylindrical axis, and wherein each RF coil element of the at least four RF coil elements of the first row has a partial overlap with one or more RF coil elements of the at least four RF coil elements of the second row, wherein the partial overlap minimizes coupling between that RF coil element and the one or more RF coil elements of the at least four RF coil elements of the second row.

9. The MRI RF coil array of claim 1, wherein, for the first primary row of the at least one primary row, the plurality of diodes of that primary row comprise, for each RF coil element of the at least four RF coil elements of that primary row, a first PIN diode that connects that RF coil element to a first neighboring RF coil element of the two neighboring RF coil elements of that RF coil element on the first end loop of that primary row and a second PIN diode that connects that RF coil element to the first neighboring RF coil element of the two neighboring RF coil elements of that RF coil element on the second end loop of that primary row.

10. The MRI RF coil array of claim 1, wherein, for the first primary row of the at least one primary row, the plurality of diodes of that primary row comprise, for each RF coil element of the at least four RF coil elements of that primary row, a first pair of cross signal diodes that connects that RF coil element to a first neighboring RF coil element of the two neighboring RF coil elements of that RF coil element on the first end loop of that primary row and a second pair of cross signal diodes that connects that RF coil element to the first neighboring RF coil element of the two neighboring RF coil elements of that RF coil element on the second end loop of that primary row.

11. The MRI RF coil array of claim 1, wherein, for the first primary row of the at least one primary row, the plurality of diodes of that primary row comprise, for each RF coil element of the at least four RF coil elements of that primary row, a first pair of back-to-back PIN diodes that connects that RF coil element to a first neighboring RF coil element of the two neighboring RF coil elements of that RF coil element on the first end loop of that primary row and a second pair of back-to-back PIN diodes that connects that RF coil element to the first neighboring RF coil element of the two neighboring RF coil elements of that RF coil element on the second end loop of that primary row.

12. The MRI RF coil array of claim 1, wherein the first secondary row is configured to wirelessly electrically couple to a transmitter through inductive coupling with the first primary row and without direct electrical coupling to the transmitter.

13. A magnetic resonance imaging (MRI) system, comprising:
a transmitter; and
a MRI radio frequency (RF) coil array configured to operate in at least one of a transmit (Tx) mode or a receive (Rx) mode on a cylindrical former, the MRI RF coil array comprising:
two or more rows of RF coil elements, wherein each row of the two or more rows of RF coil elements comprises at least four RF coil elements of that row that circumferentially enclose a cylindrical axis, wherein the two or more rows of RF coil elements comprise:
at least one primary row of RF coil elements, wherein each primary row of the at least one primary row of RF coil elements comprises a plurality of diodes of that primary row that connect each RF coil element of the at least four RF coil elements of that primary row to two neighboring RF coil elements of the at least four RF coil elements on a first end loop of that primary row and on a second end loop of that primary row, wherein, in the Tx mode, the plurality of diodes of that primary row are configured to link the at least four RF coil elements of that primary row to create a birdcage coil for that primary row, and wherein the at least one primary row comprises a first primary row directly electrically coupled to the transmitter; and
a first secondary row of RF coil elements bordering and longitudinally offset from the first primary row, wherein the first secondary row is inductively coupled to the first primary row and is electrically coupled wirelessly to the transmitter by way of inductive coupling with the first primary row in the Tx mode;
wherein, in the Rx mode, each RF coil element of each of the two or more rows of RF coil elements is configured to be tuned to a working frequency of the MRI RF coil array, and
wherein, in the Tx mode, the two or more rows of RF coil elements are configured to inductively couple together to generate a Tx field at the working frequency.

14. The MRI system of claim 13, wherein the first primary row is directly electrically coupled to the transmitter by multiple electrical connections, and wherein the multiple electrical connections directly electrically couple to the first primary row at different RF coil elements.

15. The MRI system of claim 13, wherein each RF coil element of the first secondary row is Rx only, wherein a subset of RF coil elements of the first primary row is configured for Rx and Tx, and wherein a remainder of RF coil elements of the first primary row is Rx only.

16. The MRI system of claim 13, wherein the at least four RF coil elements of the first secondary row of RF coil elements are electrically separated from each other in the Tx mode and in the Rx mode, and wherein the two or more rows of RF coil elements further comprises:
a second secondary row of RF coil elements bordering and longitudinally offset from the first primary row on an opposite side of the first primary row as the first secondary row, wherein the second secondary row comprises a plurality of diodes configured to electrically couple the at least four RF coil elements of the second secondary row into a birdcage coil distinct from that of the first primary row in the Tx mode and to electrically separate the at least four RF coil elements of the second secondary row in the Rx mode.

17. A magnetic resonance imaging (MRI) radio frequency (RF) coil array configured to operate in at least one of a transmit (Tx) mode or a receive (Rx) mode on a cylindrical former, the MRI RF coil array comprising:
two or more rows of RF coil elements, wherein each row of the two or more rows of RF coil elements comprises at least four RF coil elements of that row that circumferentially enclose a cylindrical axis, wherein the two or more rows of RF coil elements comprise:
at least one primary row of RF coil elements, wherein each primary row of the at least one primary row of RF coil elements comprises a plurality of diodes of that primary row that connect each RF coil element of the at least four RF coil elements of that primary row to two neighboring RF coil elements of that RF coil element on a first end loop of that primary row and on a second end loop of that primary row, wherein, in the Tx mode, the plurality of diodes of that primary row are configured to link the at least four RF coil elements of that primary row to create an associated birdcage coil for that primary row, and wherein the at least one primary row comprises a first primary row;
a first secondary row and a second secondary row bordering the first primary row longitudinally along the cylindrical axis and inductively coupled independently to the first primary row, wherein, in the Tx mode, a plurality of diodes of the first secondary row are configured to link the at least four RF coil elements of the first secondary row to create an associated birdcage coil through which the at least four RF coil elements of the first secondary row collectively inductively couple to the first primary row, and wherein, in the Tx mode, at least four RF coil elements of the second secondary row are configured to individually and directly inductively couple to the first primary row;
wherein, in the Rx mode, each RF coil element of each of the two or more rows of RF coil elements is configured to be tuned to a working frequency of the MRI RF coil array, and
wherein, in the Tx mode, the plurality of diodes of the at least one primary row of RF coil elements are configured to selectively operate according to one of a plurality of configurations, wherein in a first configuration the plurality of diodes of the at least one primary row of RF coil elements decouple the at least one primary row of RF coil elements, and wherein in a second configuration the plurality of diodes are configured to cause the at least one primary row of RF coil elements to be driven at the working frequency such that the two or more rows of RF coil elements are inductively coupled together to generate a Tx field at the working frequency.

18. The MRI RF coil array of claim 17, wherein the plurality of diodes of the first secondary row connect each RF coil element of the at least four RF coil elements of the first secondary row to two neighboring RF coil elements of the at least four RF coil elements on a first end loop of the first secondary row and on a second end loop of the first secondary row.

19. The MRI RF coil array of claim 17, wherein the second secondary row is devoid of diodes configured to, in the Tx mode, link the at least four RF coil elements of the second secondary row into an associated birdcage coil.

20. The MRI RF coil array of claim 17, wherein the first primary row is configured to directly couple to a transmitter, whereas the first and second secondary rows are configured to wirelessly couple to the transmitter through the first primary row.

* * * * *